United States Patent [19]
Oda

[11] Patent Number: 5,101,469
[45] Date of Patent: Mar. 31, 1992

[54] LIGHT ISOLATOR OF WAVEGUIDE TYPE

[75] Inventor: Hitoshi Oda, Sagamihara, Japan

[73] Assignee: Canon Kabushiki Kaisha, Tokyo, Japan

[21] Appl. No.: 519,178

[22] Filed: May 4, 1990

[30] Foreign Application Priority Data

May 8, 1989 [JP] Japan .................................. 1-113674

[51] Int. Cl.$^5$ ................................................ G02B 6/10
[52] U.S. Cl. .................................... 385/131; 385/130; 385/1; 385/11
[58] Field of Search ............... 350/96.12, 96.13, 96.14, 350/96.15, 355; 372/45

[56] References Cited

U.S. PATENT DOCUMENTS

| | | | |
|---|---|---|---|
| 4,121,179 | 10/1978 | Chinone et al. | 372/45 |
| 4,746,181 | 5/1988 | Hayakawa et al. | 350/96.12 |
| 4,755,015 | 7/1988 | Uno | 350/96.12 |
| 4,884,858 | 12/1989 | Ushikubo et al. | 350/96.12 X |
| 4,919,507 | 4/1990 | Evans et al. | 350/96.12 X |

FOREIGN PATENT DOCUMENTS 63-205983 8/1988 Japan .
WO88/08148 10/1988 World Int. Prop. O. .

OTHER PUBLICATIONS

Shiraishi et al., "Microisolator", *Applied Optics* 25:2:311–314 (Jan. 1986).

Primary Examiner—John D. Lee
Assistant Examiner—Phan T. Heartney
Attorney, Agent, or Firm—Fitzpatrick, Cella, Harper & Scinto

[57] ABSTRACT

A waveguide type light isolator capable of easily matching the phases of the TE wave and TM wave comprises a substrate and a light waveguide layer formed on the substrate. The waveguide layer has a super lattice structure in which well layers and barrier layers are alternately laminated. At least one of the well layers and barrier layers contains magnetic ions. The energy between an electron and a light hole in the light waveguide layer is larger than that of light propagating in the waveguide layer. Further, the energy between an electron and a heavy hole in light waveguide layer is smaller than that of light propagating in the waveguide layer.

30 Claims, 6 Drawing Sheets

LIGHT ISOLATOR OF WAVEGUIDE TYPE

BACKGROUND OF THE INVENTION

1. Field of the Invention

The present invention relates to a light isolator of the waveguide type which is suitably used in a light communication system or the like.

2. Related Background Art

In recent years, the necessity for light communication increases more and more with a rapid increase in information amount. The light communication system includes middle and long distance transmission systems using a laser beam of a band within a range from 1.3 to 1.5 μm and a short distance transmission system such as an LAN (local area network) or the like using a laser beam of a band of 0.8 μm. In any of the above cases, the light emitted from a semiconductor laser is converted onto an edge surface of an optical fiber and is waveguided in the fiber. At this time, the lights reflected by the fiber edge surface or the edge surfaces of other optical parts are returned to an active layer of the semiconductor laser. Thus, the oscillation of the semiconductor laser becomes unstable and a power fluctuation and a wavelength fluctuation occur. Particularly, a large influence is exerted on a distributed Bragg reflection (DBR) laser in a manner such that the single mode is changed to the multimode or the like. On the other hand, in the coherent light communication which is highlighted as a future communication system, information is expressed by merely changing the phase without executing the intensity modulation of the light. Thus, in particular, the coherent light communication is largely influenced by the returned lights.

To eliminate the returned lights, a light isolator is inevitable. At present, as a material of light isolator, a YIG (yttrium-iron-garnet) monocrystal or a paramagnetic glass in which rare earth ions are added is used. FIG. 1 shows a structure of a light isolator using a magnetooptical monocrystal which has been put into practical use at present.

Reference numeral 61 denotes a YIG monocrystal. A length l of crystal 61 is set to that a polarizing surface rotates by an angle of 45° when a laser beam 65 of the linear polarization is transmitted in the crystal 61. That is, assuming that a Faraday rotation angle per unit length is set to $\theta_F$, l is given by $$l = \frac{45°}{\theta_F}$$

Reference numerals 63 and 64 denote polarizing plates and their major axes are set so as to form an angle difference of 45°. Reference numeral 62 denotes a hollow cylindrical permanent magnet. The magnetization of the magnet 62 is saturated by applying a bias magnetic field to the YIG monocrystal 61.

FIG. 2 shows an example of a light isolator of a conventional waveguide structure to realize a small size and low costs.

A laser beam 75 is waveguided in a magneto-optical monocrystalline thin film 71 which has grown on a monocrystalline substrate 72. At this time, the polarizing surface of the laser beam 75 is rotated by an angle of 45° by the Faraday effect. In a manner similar to the light isolator shown in FIG. 1, there is an angle difference of 45° between the major axes of polarizing plates 73 and 74.

The above waveguide type light isolator has an advantage such that it can be constructed in a small size and a light weight and interest has been shown in substituting it for a bulk type light isolator. On the other hand, the waveguide type light isolator is being developed as a key device when forming an OEIC (photoelectron integrated circuit).

However, the above waveguide type light isolator has the following drawbacks.

(I) According to the waveguide type light isolator which has been being developed at present, a Bi added YIG thin film is grown onto a GGG (gadolinium-gallium-garnet) monocrystalline substrate by an LPE (liquid phase epitaxy) method or a sputtering method. On the other hand, a compound semiconductor such as GaAs, InP, or the like is used as a subtract of the OEIC. It is difficult to epitaxially grow a YIG film as an oxide onto the substrate of GaAs or the like from a viewpoint of the differences of a lattice constant and a thermal expansion coefficient. Therefore, there is a large obstacle when such a method is applied to an integrated device.

(II) To develop the waveguide type light isolator, it is necessary to realize the phase matching between the TE wave and the TM wave.

FIGS. 3A to 3C show a method of realizing the phase matching. When a laser beam is waveguided in the film as shown in FIG. 3A, in the case of a certain limited film thickness $h_0$, a refractive index to the TE wave is larger than that to the TM wave because of the shape birefringence as shown in FIG. 3B. A propagation constant difference $\Delta\beta$ to the TE wave and TM wave is given by $$\Delta\beta = \beta_{TE} - \beta_{TM} = \frac{2\pi}{\lambda}(n_{TE} - n_{TM}) \quad (1)$$

where,

λ: wavelength of laser beam
$n_{TE}$: refractive index to the TE wave
$n_{TM}$: refractive index to the TM wave When the laser beam was waveguided by only the distance l, a mode conversion efficiency R from the TE wave to the TM wave is $$R = \frac{\theta_F^2}{\theta_F^2 + (\Delta\beta/2)^2} \sin^2[\sqrt{\theta_F^2 + (\Delta\beta/2)^2} \cdot l] \quad (2)$$

where, $\theta_F$: Faraday rotation angle per unit length.

As will be understood from the above equations, to improve the mode conversion efficiency, it is necessary to satisfy the condition of $\Delta\beta=0$, that is, $n_{TE}=n_{TM}$. Therefore, as shown in FIG. 3C, there has been continued an effort to realize $n_{TE}=n_{TM}$ at a certain film thickness by giving the anisotropy in the direction perpendicular to the film surface by some means. Practically speaking, for instance, in the case of a garnet film, there has been executed a trial such as to provide a distortion inducing birefringence using a lattice constant difference between the substrate and the film or a growth inducing birefringence by controlling a temperature or compositions upon growing. However, to realize the phase matching by using those birefringences, it is necessary to strictly control the film forming conditions, so that the realization of such a method is not practical.

(III) Since the absorbing property of magnetic garnet for the light of 0.8 μm is large, only the light isolator for the light of 1.3 to 1.5 μm has been put into practical use at present. In the case of the garnet film, there is a limitation when a transmission factor for the light of 0.8 μm is raised, so that it is demanded to develop a new material.

As described above, the waveguide type light isolator using a magnetic garnet film has a problem such that the integration with the laser is difficult. On the other hand, there is also a problem such that refractive indices to the TE wave and TM wave differ due to the shape birefringence, so that it is difficult to execute the phase matching. Further, since the absorption is large in the band of 0.8 μm, there is a problem such that the magnetic garnet film cannot be used as a light isolator in such a band.

SUMMARY OF THE INVENTION

It is an object of the present invention to solve the problems of the above conventional techniques and to provide a waveguide type light isolator which can easily match the phases of the TE wave and TM wave.

Another object of the invention is to provide a waveguide type light isolator suitable to integrate with a semiconductor laser.

Still another object of the invention is to provide a waveguide type light isolator which can be also used for a light having a wavelength of about 0.8 μm.

The above objects of the invention are accomplished by a waveguide type light isolator comprising: a substrate; and a light waveguide layer which is formed on the substrate and has a super lattice structure in which well layers and barrier layers are alternately laminated, in which at least one of the well layers and barrier layers contains magnetic ions, wherein an energy between an electron and a light hole in the light waveguide layer is larger than an energy of light which is propagated in the waveguide layer, and an energy between an electron and a heavy hole in the light waveguide layer is smaller than the energy of light which propagates in the waveguide layer.

DETAILED DESCRIPTION OF THE PREFERRED EMBODIMENTS

Figure 4:
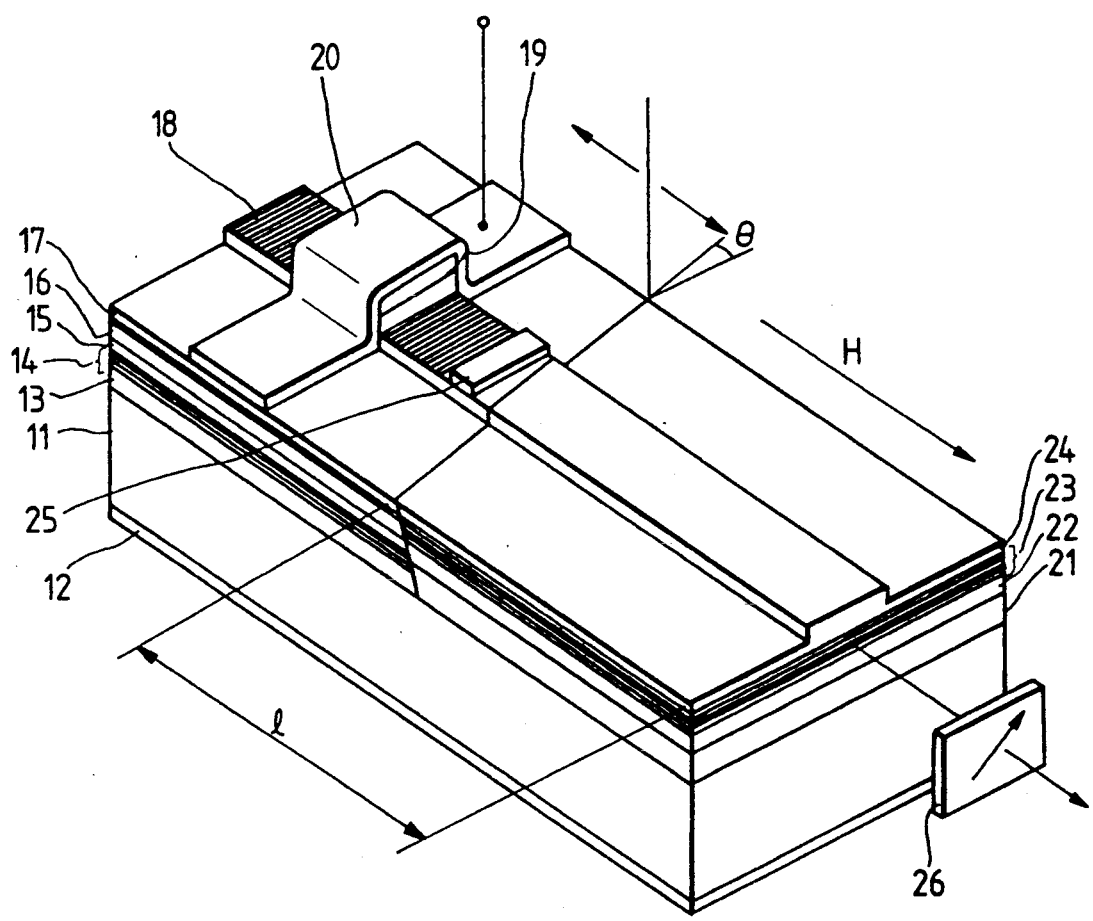
FIG. 4 is a schematic perspective view showing the first embodiment of a waveguide type light isolator according to the present invention.

FIG. 4 is a schematic perspective view showing a construction of the first embodiment of a waveguide type light isolator according to the present invention.

The embodiment shows an example in which a DBR laser and the light isolator are integrated.

A structure of a DBR laser section will be first described.

A clad layer of n-$Al_{0.5}Ga_{0.5}As$ having a thickness of 0.5 μm, a super lattice active layer 14 of i-GaAs/AlAs having a thickness of 0.1 μm, and a clad layer 15 of p-$Al_{0.5}Ga_{0.5}As$ having a thickness of 0.5 μm were sequentially epitaxially grown onto an n type GaAs substrate 11.

The active layer 14 is formed by alternately laminating a number of GaAs layers and AlAs layers each having a thickness of tens of Å. Subsequently, a first light waveguide layer 16 comprising p-$Al_{0.2}Ga_{0.8}As$ and having a thickness of 0.2 μm, a clad layer 17 of p-$Al_{0.5}Ga_{0.5}As$ having a thickness of 0.5 μm, and p+-GaAs contact layer 19 were sequentially epitaxially grown onto the clad layer 15. Next, after the clad layer 17 had been etched in a ridge shape, a corrugation 18 for the DBR was formed onto the upper surface of the clad layer 17 by a double light flux interference exposing method. In the case of using a laser beam of a band of 0.8 μm, a secondary grating (pitch: about 0.25 μm) is formed by the corrugation.

A half part of the chip formed as mentioned above was etched and deleted until the GaAs substrate by inclining at an angle of a few degree ($\theta$) from the line segment which is perpendicular to the progressing direction of the laser beam and in parallel with the substrate laminate surface as shown in the diagram. An isolator portion was formed in the deleted portion by the following steps.

First, a CdTd buffer layer 21 having a thickness of 0.6 μm, a $Cd_{0.5}Mn_{0.5}Te$ clad layer 22 having a thickness of 0.5 μm, and a CdTe/$Cd_{0.5}Mn_{0.5}Te$ super lattice layer (second light waveguide layer) 23 having a thickness of 0.2 μm were sequentially epitaxially grown onto the GaAs substrate 11 which had been exposed by etching. The waveguide layer 23 is formed by alternately laminating a number of CdTe layers and CdMnTe layers each having a thickness of several tens of Å. The CdMnTe layer corresponds to a layer containing magnetic ions.

A $Cd_{0.5}Mn_{0.5}Te$ clad layer 24 having a thickness of 0.5 μm was epitaxially grown onto the waveguide layer 23. After that, the clad layer 24 was etched in a ridge shape so as to become a shape similar to the laser portion.

A p-type electrode 20 comprising AuGe/Ni/Au was formed in the laser portion of the chip formed as mentioned above. On the other hand, an n-type electrode 12 comprising Cr/Au was evaporation deposited onto the bottom portion of the substrate 11. Further, a metal film 25 of Al or the like was formed as a mode selection film onto the ridge near the boundary between the laser portion and the isolator portion.

In the device constructed as mentioned above, by supplying a current between the electrodes 12 and 20, a light is generated from the active layer 14. The light is propagated in the first waveguide layer 16. The propagation light is reflected by a diffraction grating constructed by the corrugation 18 and causes a laser oscillation. The laser beam generated by the laser oscillation is coupled from the first waveguide layer 16 to the second waveguide layer 23 of the isolator portion. The laser beam is propagated in the second waveguide layer 23 and is emitted to the outside.

A polarizing plate 26 is arranged in the emission optical path of the laser beam. The major axis of the polarizing plate 24 is set to an angle of 45° from the in-plane direction of the waveguide layer 23. On the other hand, an external magnetic field H such as to rotate the polarizing direction of the light propagating in the waveguide layer 23 by an angle of 45° is applied to the waveguide layer 23.

The phase matching in the isolator of the invention will now be described.

Figure 5A:
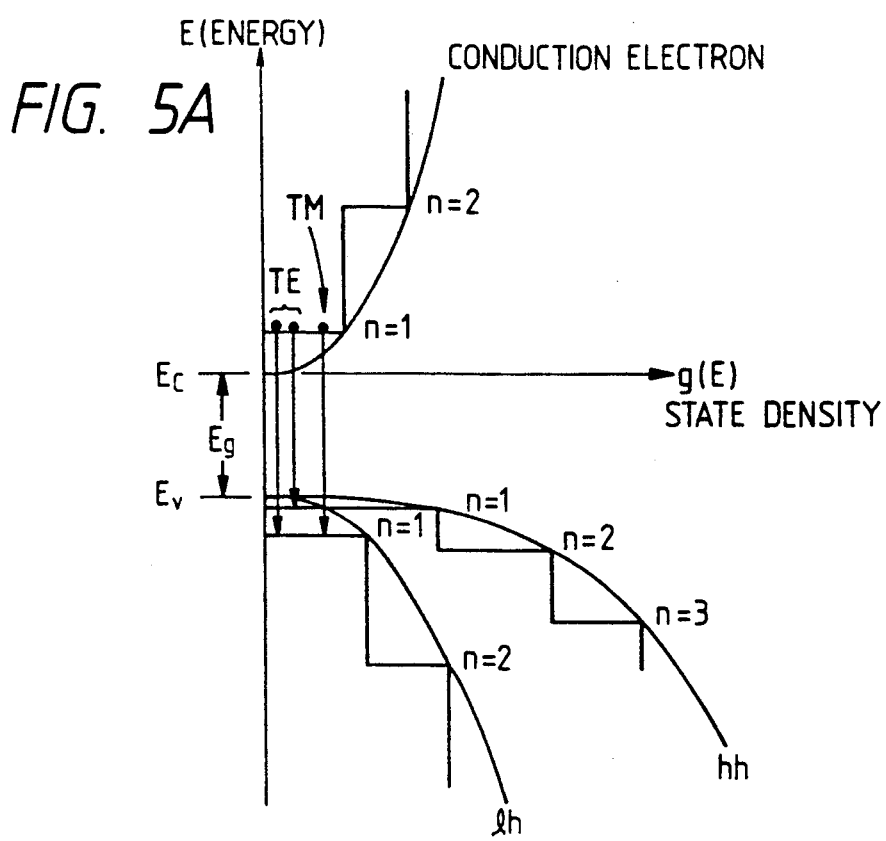
FIG. 5A is a diagram showing a state density in a waveguide layer of the invention.

FIG. 5A is a diagram showing a state density of the CdTe/CdMnTe waveguide layer 23.

Figure 1:
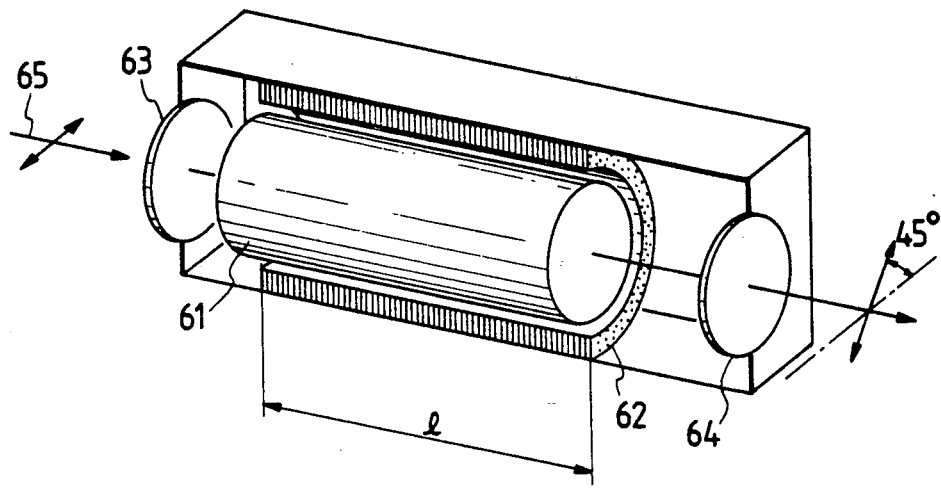
FIG. 1 is a perspective view with a part cut away showing an example of a conventional bulk type light isolator.
Figure 2:
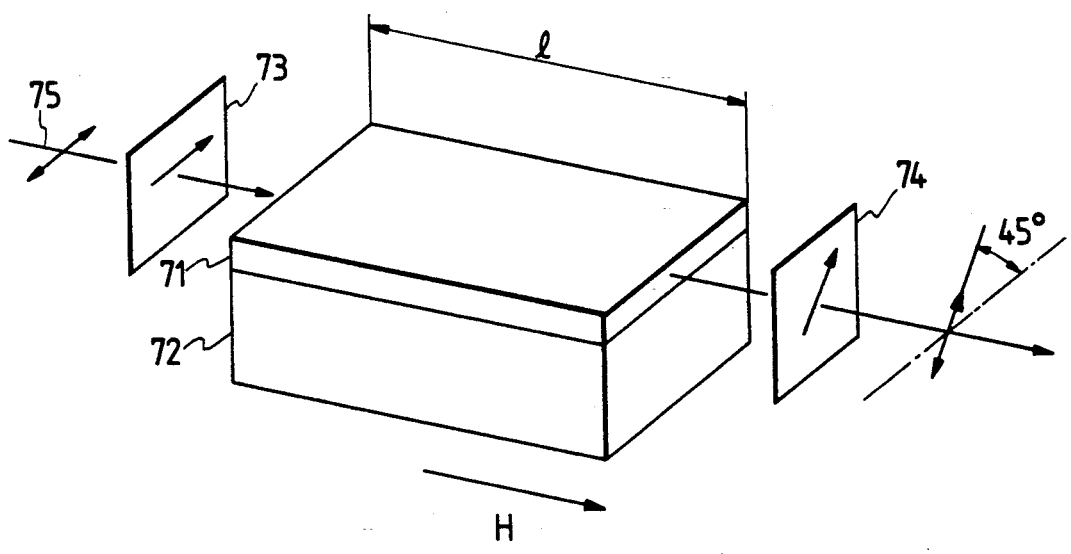
FIG. 2 is a schematic perspective view showing an example of a conventional waveguide type light isolator.
Figure 3A:
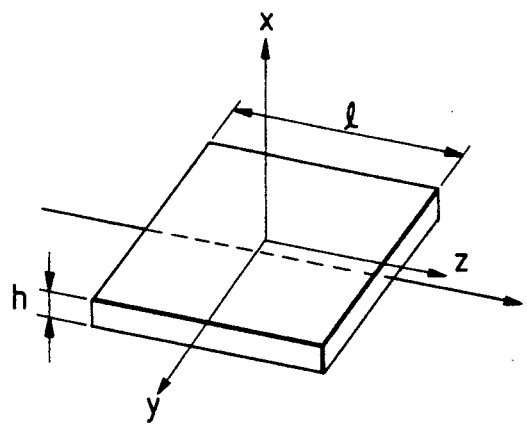
FIGS. 3A to 3C are diagrams for explaining effective refractive indices of the lights which propagate in waveguides, respectively.
Figure 3B:
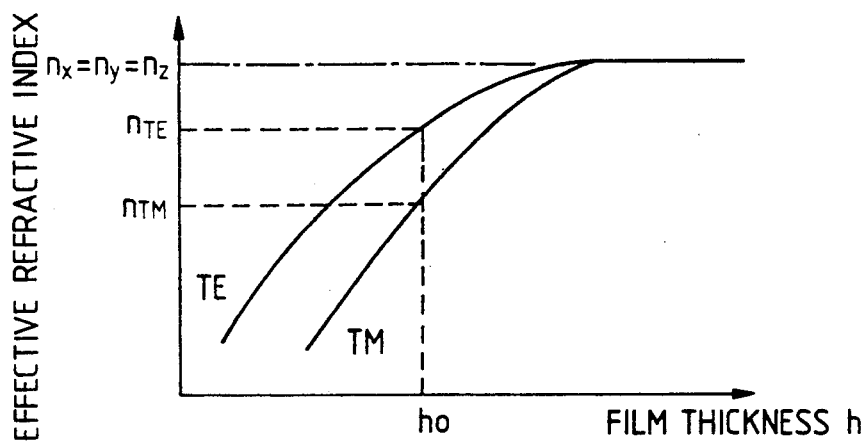
Figure 3C:
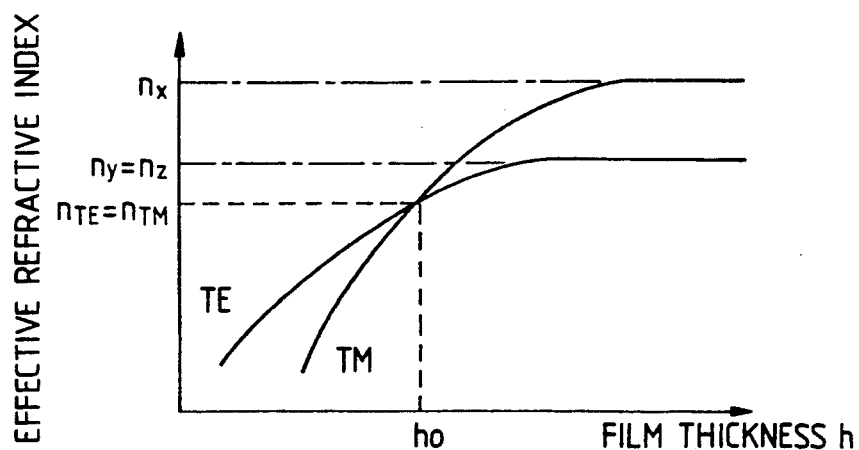
Figure 5B:
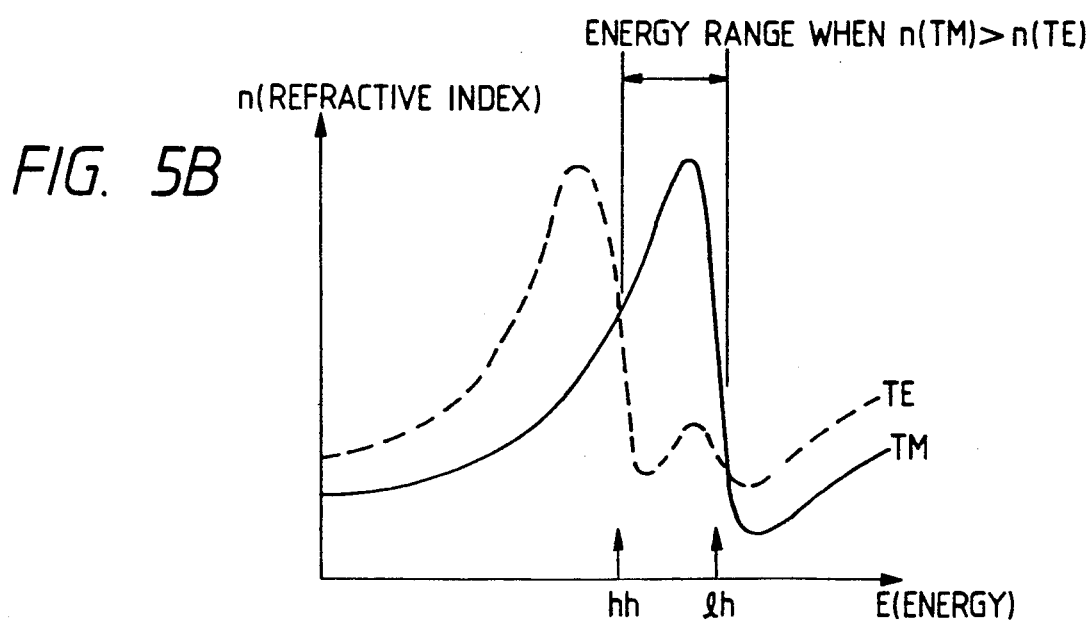
FIG. 5B is a diagram showing refractive indices to the TE wave and TM wave in the waveguide layer of the invention.

In the bulk state, a parabolic state density is provided. However, according to the isolator of the embodiment, the state density has a stairway shape to shut off in the film thickness direction. Therefore, the holes are separated into two stairway-like energy levels of a heavy hole (hh) and a light hole (lh). A refractive index of the portion near the band gap is dominated by the transition between the electron and the heavy hole and between the electron and the light hole at the quantum level $N=1$. Although both of the heavy and light holes contribute to the TE wave, since the transition between the heavy hole and the electron is inhibited for the TM wave, only the contribution from the light hole exists due to the symmetry of the wave function. Therefore, the refractive index of the portion near the band gap is as shown in FIG. 5B. That is, at the energy between the heavy hole (hh) and the light hole (l h), the refractive index to the TM wave is larger than that to the TE wave. Thus, for the light of a wavelength within such an energy range, as shown in FIG. 3C, a super lattice film thickness at which the refractive index $n_{TE}$ to the TE wave and the refractive index $n_{TM}$ to the TM wave are equal exists. Since $\Delta\alpha=0$ as mentioned above for such a film thickness, the TE-TM mode conversion of 100% can be realized and the isolator according to the embodiment is also constructed as mentioned above.

Figure 6:
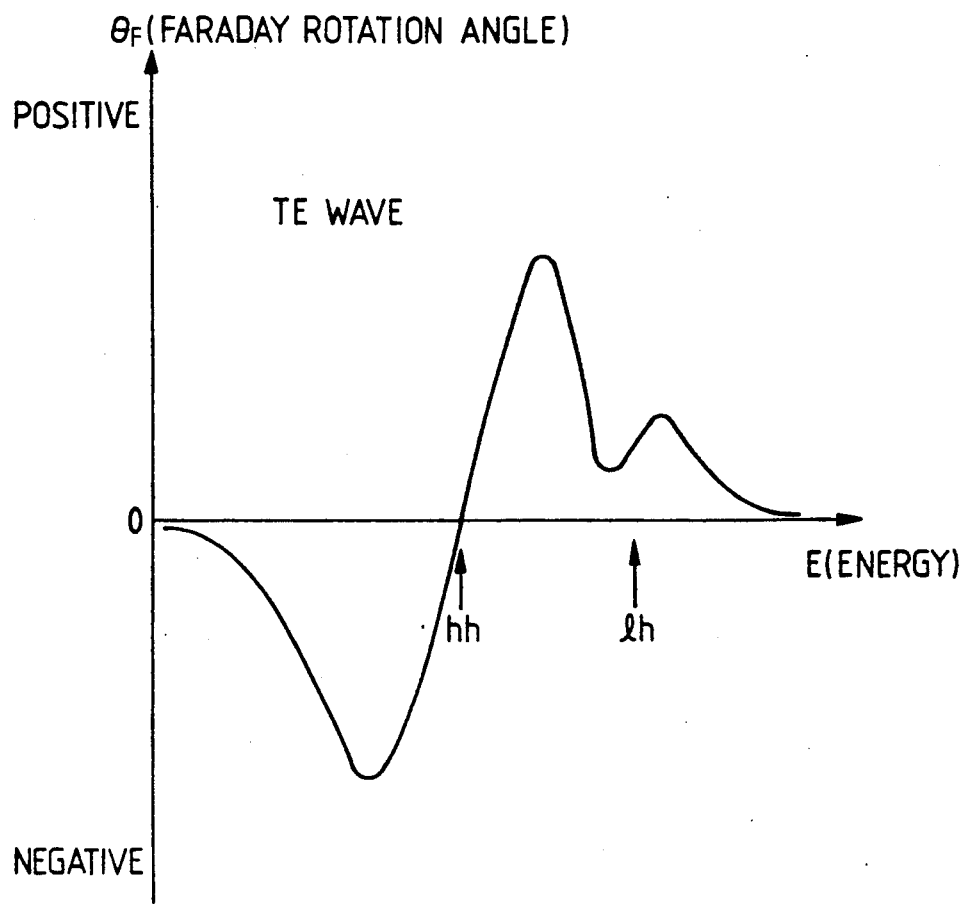
FIG. 6 is a diagram showing a wavelength diffusion of a Faraday rotation angle in the waveguide layer of the invention.

On the other hand, it is known that the CdTe/CdMnTe super lattice film constructing the waveguide layer 23 provides a large magnetooptical effect due to the interaction of the magnetic spin having $Mn^{2+}$ ions and the conductive electron spin. The Faraday rotation angle shows a waveform diffusion as shown in FIG. 6 and has the maximum value ($\theta_F$: 1000°/cm) within an energy range between the heavy hole (hh) and the light hole (l h). Therefore, it will be understood that a film thickness which can realize the phase matching (that is, $\Delta\beta=0$) at the light of the wavelength corresponding to such a maximum value exists. When the polarizing surface is rotated by 45°, to obtain the Te-TM mode conversion efficiency of 50%, the waveguide length l is set to 450 μm on the assumption that $R=50\%$, $\Delta\alpha=0$, and $\theta_F=1000°/cm$ from the equation (2).

The operation principle of the embodiment will now be described.

Although the light oscillated in the DBR laser section passes under the metal film 25 as a mode selection film, it is not attenuated because it is the TE light.

When the light enters from the first waveguide layer 16 into the second waveguide layer 23, reflected lights are caused due to the difference of the refractive indices.

However, since the coupling surface has an inclination angle of a few degrees from the progressing direction of the light as shown in the diagram, the reflected lights are emitted to the outside of the ridge and are not returned to the laser oscillating section.

Figure 7:
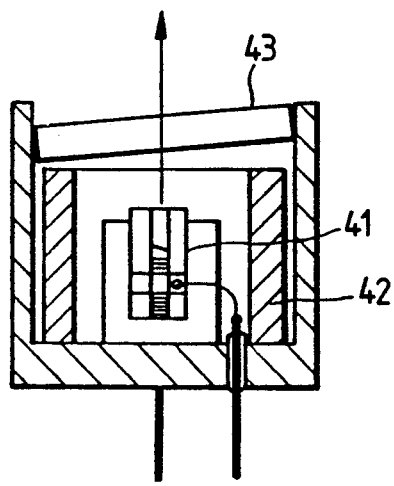
FIG. 7 is a schematic cross sectional view showing a light source apparatus in which a device shown in FIG. 4 is packaged.

The light which was propagated in the second waveguide layer 23 and whose polarizing direction was rotated by an angle of 45° passes through the polarizing plate 26 having the major axis in the same direction as the polarizing direction and emits. Among the emitted lights, the returned lights which were reflected by various edge surfaces again enter the polarizing plate 26 and only the light whose polarizing direction is inclined by 45° passes and enters the waveguide layer 23. When the incident light is waveguided in the waveguide layer 23 in the opposite direction, the mode is further converted by the nonreciprocity of the magnetooptical effect and becomes the TM wave at the boundary surface between the isolator and the laser. Thus, the incident light is absorbed by the metal film 25 and is not returned to the laser. FIG. 7 is a diagram showing an example of a construction of a light source apparatus which is constructed by packaging the integrated chip shown in FIG. 4. A chip 41 is bonded and enclosed in a ring-shaped permanent magnet 42. Therefore, a predetermined bias magnetic field is applied to the chip 41 by the magnet 42. A polarizing plate 43 is slightly obliquely set, thereby preventing that the unnecessary reflected lights are returned to the chip 41.

Figure 8:
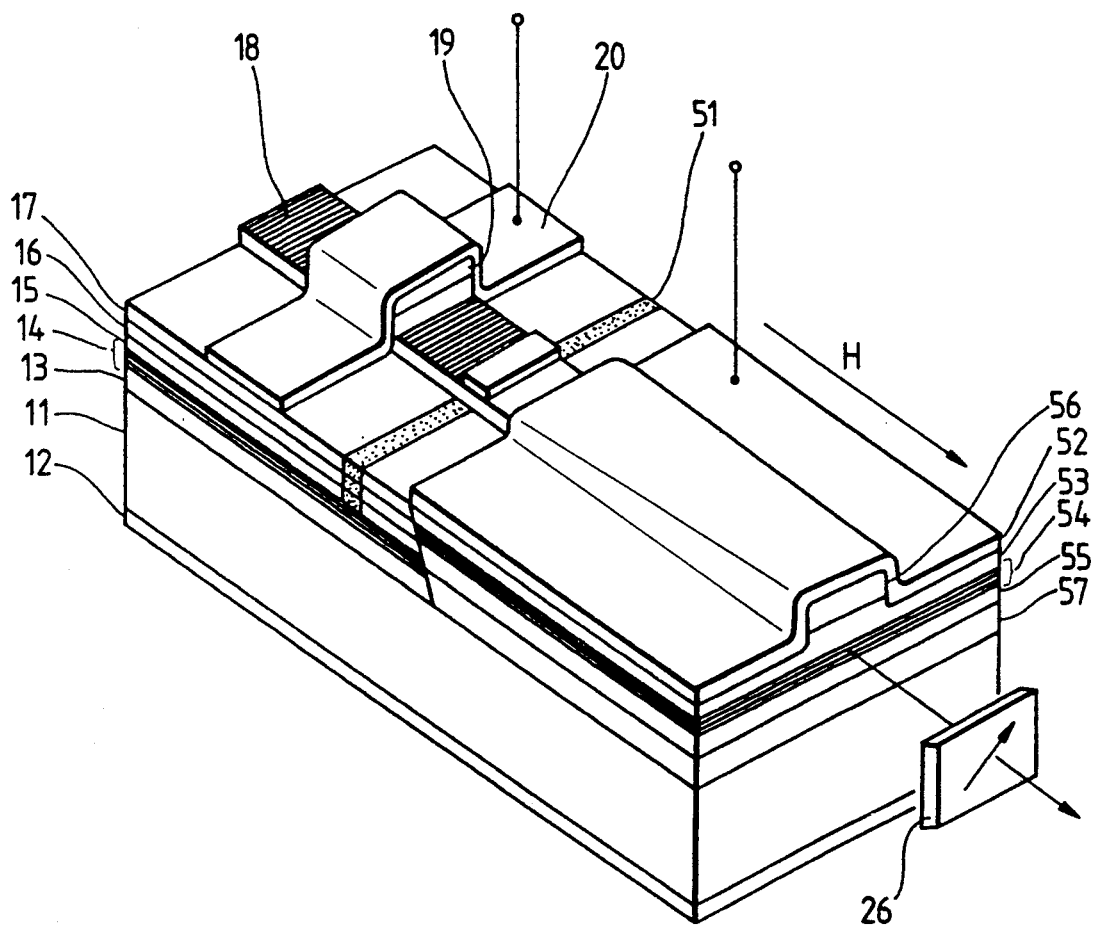
FIG. 8 is a schematic perspective view showing the second embodiment of a waveguide type light isolator of the invention.

FIG. 8 is a schematic perspective view showing a construction of the second embodiment of a waveguide type light isolator of the invention.

In the embodiment, a QCSE (quantum confined stark effect) by the application of a reverse bias voltage is used. In FIG. 8, the same parts and components as those shown in FIG. 4 are designated by the same reference numerals and their detailed descriptions are omitted.

In the embodiment, although a laser section has substantially the same construction as that of the device shown in FIG. 4, an insulative portion 51 is further provided between the laser section and the isolator section, thereby electrically isolating each section. A layer construction and a material of each layer of the isolator section are the same as those shown in FIG. 4. However, in the embodiment, a waveguide layer 54 is formed as a nondoped layer, a clad layer 55 and a buffer layer 57 are doped into the n-type, and a clad layer 53 is doped into the p-type. That is, a p-i-n structure is formed by those semiconductor layers. On the other hand, an electrode 52 is formed on the clad layer 53 through a contact layer 56. A reverse bias voltage is applied to the p-i-n structure by the electrode.

In the embodiment, by applying the reverse bias voltage to the isolator section, energy levels of the heavy hole (hh) and light hole (l h) of the super lattice layer 54 are shifted by the QCSE. Thus, the phase matching condition of $n_{TE}=n_{TM}$ can be easily realized. The principle of the subsequent light isolation is substantially the same as that in the first embodiment.

The present invention is not limited to only the above-described embodiments but many modifications and variations are possible. For instance, although the active layer and the light waveguide layer have been formed as different layers in the laser section of the embodiments, those layers can be also constructed by a single common layer. Although each of the embodiments has been described with respect to $CdTe/Cd_xMn_{1-x}Te$ ($0<x\leq0.7$) as components construction the super lattice layer, it is also possible to use $Zn_{1-x}Mn_xSe$ ($0<x\leq0.6$) as the same II-VI group semiconductors or the like.

The present invention incorporates all of the modifications and variations as mentioned above within the spirit and scope of the appended claims of the invention.

What is claimed is:

1. A waveguide type light isolator comprising:

a substrate; and a light waveguide layer which is formed on the substrate and has a super lattice structure in which well layers and barrier layers are alternately laminated, in which at least one of said well layers and barrier layers contains magnetic ions;

wherein an energy between an electron and a light hole in said light waveguide layer is larger than an energy of a light which is propagated in the waveguide layer and an energy between an electron and a heavy hole in the light waveguide layer is smaller than an energy of the light which is propagated in the waveguide layer.

2. An isolator according to claim 1, wherein a refractive index of the light waveguide layer to the light in the TE mode is equal to a refractive index of the light waveguide layer to the light in the TM mode.

3. An isolator according to claim 1, further comprising means for applying a magnetic field to the light waveguide layer.

4. An isolator according to claim 3, wherein said magnetic field applying means comprises a permanent magnet arranged near the light waveguide layer.

5. An isolator according to claim 1, further comprising:

first and second clad layers having polarities which are opposite to each other in which said light waveguide layer is sandwiched; and an electrode to apply a reverse bias electric field to the light waveguide layer and the first and second clad layers.

6. An isolator according to claim 1, further comprising a polarizing plate arranged in an optical path of the light which passed in the light waveguide layer.

7. An isolator according to claim 6, wherein the light waveguide layer rotates the polarizing direction of the light propagating therein by an angle of 45°, and a major axis of the polarizing plate is set to an inclination angle of 45° from an in-plane direction of the light waveguide layer.

8. An isolator according to claim 6, wherein said polarizing plate is arranged at an angle which is not perpendicular to an optical axis of the light which passed in the light waveguide layer.

9. An isolator according to claim 1, wherein the light waveguide layer is formed by alternately laminating CdTe layers and CdMnTe layers.

10. A waveguide type light isolator which is integrated to a semiconductor laser, comprising:

a substrate;

a laser section which is formed on the substrate and comprises a semiconductor active layer to generate a laser beam by being supplied with a current and an electrode to supply the current to said active layer; and an isolator section which is formed on the same substrate as that of the laser section and comprises a light waveguide layer which is optically coupled with the active layer, in which said waveguide layer has a super lattice structure in which well layers and barrier layers are alternately laminated and at least one of the well layers and barrier layers contains magnetic ions, wherein the laser beam generated from the active layer of the laser section is propagated in the waveguide layer of the isolator section and is emitted, and an energy of the laser beam is larger than an energy between an electron and a heavy hole in the waveguide layer and is smaller than an energy between an electron and a light hole in the waveguide layer.

11. An isolator according to claim 10, wherein a refractive index of the light waveguide layer to the light in the TE mode is equal to a refractive index of the light waveguide layer to the light in the TM mode.

12. An isolator according to claim 10, further comprising means for applying a magnetic field to the light waveguide layer.

13. An isolator according to claim 12, wherein said magnetic field applying means comprises a permanent magnet arranged near the light waveguide layer.

14. An isolator according to claim 10, wherein said isolator section further comprises:

first and second clad layers having polarities which are opposite to each other in which the light waveguide layer is sandwiched; and a second electrode to apply a reverse bias electric field to the light waveguide layer and the first and second clad layers.

15. An isolator according to claim 14, wherein an insulative portion is provided between the laser section and the isolator section in order to electrically isolate the laser section and the isolator section.

16. An isolator according to claim 10, further comprising mode selecting means, provided in a boundary portion between the laser section and the isolator section, for transmitting the light in the TE mode and selectively absorbing the light in the TM mode.

17. An isolator according to claim 16, wherein said mode selecting means comprises a metal film which is formed on the active layer of the laser section.

18. An isolator according to claim 10, wherein a boundary surface between the laser section and the isolator section has a predetermined angle which is not zero for a line segment which is perpendicular to the propagating direction of the light and in parallel with the surface of the substrate.

19. An isolator according to claim 10, wherein said laser section further comprises a second light waveguide layer for propagating the light generated from the active layer and leading to the light waveguide layer of the isolator section.

20. An isolator according to claim 10, further comprising a polarizing plate arranged in an optical path of the light which passed in the light waveguide layer.

21. An isolator according to claim 20, wherein said light waveguide layer rotates a polarizing direction of the light propagating therein by an angle of 45°, and a major axis of the polarizing plate is set to an inclination angle of 45° from an in-plane direction of the light waveguide layer.

22. An isolator according to claim 20, wherein said polarizing plate is arranged at an angle which is not perpendicular to an optical axis of the light which passed in the light waveguide layer.

23. An isolator according to claim 10, wherein said laser section has a distributed Bragg reflection (DBR) structure provided with a grating.

24. An isolator according to claim 10, wherein the light waveguide layer is formed by alternately laminating CdTe layers and CdMnTe layers.

25. An isolator according to claim 10, wherein said laser section is formed by GaAs and AlGaAs.

26. A thin film light waveguide comprising:
substrate; and
a light waveguide layer formed on said substrate, said light waveguide layer having a super lattice structure in which well layers composed of semiconductor and barrier layers composed of semiconductor are alternately laminated;
wherein the energy between an electron and a light hole in said light waveguide layer is larger than an energy of a light which is propagated in the waveguide layer, and an energy between an electron and a heavy hole in said light waveguide layer is smaller than an energy of the light which is propagated in the waveguide layer.

27. A thin film light waveguide according to claim 26, wherein a refractive index of said light waveguide layer to the light in the TE mode is equal to a refractive index of the light waveguide layer to the light in the TM mode.

28. A method for matching a phase of a light which is propagated in a thin film waveguide comprising a substrate and a light waveguide layer formed on the substrate and having a super lattice structure in which at least one semiconductor well layer and at least one semiconductor barrier layer are alternately laminated, said method comprising the steps of:
propagating in said light waveguide layer a light having an energy which is smaller than an energy between an electron and a light hole in said light waveguide layer and which is larger than an energy between an electron and a heavy hole in said light waveguide layer, wherein a phase difference is caused in the propagated light by a shape birefringence of said light waveguide layer; and
causing a phase difference opposite to the phase difference due to the shape birefringence in the propagated light by a quantum effect of said super lattice structure of said light waveguide layer.

29. A method according to claim 28, wherein the phase difference due to the quantum effect cancels the phase difference due to the shape birefringence.

30. A method according to claim 28 further comprising the step of applying an electric field to said light waveguide layer.

* * * * *

UNITED STATES PATENT AND TRADEMARK OFFICE
CERTIFICATE OF CORRECTION

PATENT NO. : 5,101,469
DATED : March 31, 1992
INVENTOR(S) : Hitoshi Oda

It is certified that error appears in the above-identified patent and that said Letters Patent is hereby corrected as shown below:

COLUMN 1:

Line 44, "to" should read --so--.

COLUMN 2:

Line 13, "being" should be deleted.
  Line 18, "subtract" should read --substrate--.

COLUMN 3:

Line 66, "cross sectional" should read --cross-sectional--.

COLUMN 4:

Line 36, "degree" should read --degrees--.

COLUMN 5:

Line 11, "plate 24" should read --plate 26--.
  Line 43, "$\Delta\alpha=0$" should read --$\Delta\beta=0$--.
  Line 60, "Te-TM" should read --TE-TM--.
  Line 62, "$\Delta\alpha=0,$" should read --$\Delta\beta=0,$--.

UNITED STATES PATENT AND TRADEMARK OFFICE
CERTIFICATE OF CORRECTION

PATENT NO. : 5,101,469
DATED : March 31, 1992
INVENTOR(S) : Hitoshi Oda

It is certified that error appears in the above-identified patent and that said Letters Patent is hereby corrected as shown below:

COLUMN 7:

Line 5, "struction" should read --structing--.

COLUMN 9:

Line 12, "substrate;" should read --a substrate;--.

COLUMN 10:

Line 25, "claim 28" should read --claim 28,--.

Signed and Sealed this

Twentieth Day of July, 1993

Attest:

MICHAEL K. KIRK

*Attesting Officer*  *Acting Commissioner of Patents and Trademarks*